United States Patent
Moon et al.

(10) Patent No.: US 7,667,481 B2
(45) Date of Patent: Feb. 23, 2010

(54) SURFACE ELECTRON EMISSION DEVICE ARRAY AND THIN FILM TRANSISTOR INSPECTION SYSTEM USING THE SAME

(75) Inventors: Chang-Wook Moon, Seoul (KR); El Mostafa Bourim, Yongin-si (KR); Sung-Jin Lee, Suwon-si (KR); Seung-Woon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/644,885

(22) Filed: Dec. 26, 2006

(65) Prior Publication Data

US 2007/0164773 A1 Jul. 19, 2007

(30) Foreign Application Priority Data

Dec. 30, 2005 (KR) .................. 10-2005-0135840

(51) Int. Cl.
*G01R 31/00* (2006.01)
(52) U.S. Cl. .......................... 324/770; 345/87
(58) Field of Classification Search ............. 324/754, 324/769–770; 345/74, 75, 87, 90, 92; 315/169.1–169.3; 313/495–497, 309–311
See application file for complete search history.

(56) References Cited

U.S. PATENT DOCUMENTS

| | | | | | |
|---|---|---|---|---|---|
| 3,789,471 | A | * | 2/1974 | Spindt et al. ............... 445/52 |
| 5,036,317 | A | * | 7/1991 | Buzak .................... 345/74.1 |
| 5,258,705 | A | * | 11/1993 | Okamoto et al. ........... 324/770 |
| 5,504,187 | A | * | 4/1996 | Kunishi et al. ........... 528/502 F |
| 5,546,013 | A | * | 8/1996 | Ichioka et al. ............. 324/770 |
| 5,691,793 | A | * | 11/1997 | Watanabe et al. ........... 349/155 |
| 5,903,092 | A | * | 5/1999 | Akama ................... 313/311 |
| 6,084,579 | A | * | 7/2000 | Hirano ................... 345/205 |
| 6,094,187 | A | * | 7/2000 | Jones et al. ............... 345/690 |
| 6,169,528 | B1 | * | 1/2001 | Oguchi et al. ............ 345/74.1 |
| 6,429,835 | B1 | * | 8/2002 | Browning et al. .......... 345/74.1 |
| 6,608,620 | B1 | * | 8/2003 | Suzuki et al. ............. 345/204 |
| 6,859,052 | B1 | * | 2/2005 | Vaucher ................... 324/751 |

(Continued)

FOREIGN PATENT DOCUMENTS

KR 2003-0004390 1/2003

(Continued)

OTHER PUBLICATIONS

Korean Office Action dated Nov. 9, 2006.

*Primary Examiner*—Ha Tran T Nguyen
*Assistant Examiner*—Arleen M Vazquez
(74) *Attorney, Agent, or Firm*—Harness, Dickey & Pierce, PLC (57) ABSTRACT

A surface electron emission device array and a TFT inspection system for inspecting a TFT array using a surface electron emission device array may be provided. The TFT inspection system may include a surface electron emission device array, which may have a first electrode disposed to face the TFT array in a first direction, a second electrode disposed in a second direction intersecting the first direction in a region corresponding to a region in which the first electrode and a corresponding pixel electrode of the TFT array may be formed, and an insulating layer interposed between the first electrode and the second electrode.

22 Claims, 8 Drawing Sheets

U.S. PATENT DOCUMENTS

| | | | |
|---|---|---|---|
| 6,995,576 B2 * | 2/2006 | Imai | 324/751 |
| 7,196,536 B2 * | 3/2007 | Nystrom et al. | 324/765 |
| 2005/0140306 A1 * | 6/2005 | Park | 315/169.3 |
| 2006/0232261 A1 * | 10/2006 | Hiroki | 324/96 |
| 2008/0093973 A1 * | 4/2008 | Jung et al. | 313/495 |

FOREIGN PATENT DOCUMENTS

WO   WO 2002/071434   9/2002

* cited by examiner

SURFACE ELECTRON EMISSION DEVICE ARRAY AND THIN FILM TRANSISTOR INSPECTION SYSTEM USING THE SAME

PRIORITY STATEMENT

This application claims the benefit of priority to Korean Patent Application No. 10-2005-0135840, filed on Dec. 30, 2005, in the Korean Intellectual Property Office, the entire contents of which is incorporated herein in its entirety by reference.

BACKGROUND

1. Field

Example embodiments relate to a surface electron emission device array, for example, to a TFT inspection system for inspecting a TFT array using a surface electron emission device array, which may be used to more accurately inspect unit TFTs of the TFT array by providing the surface electron emission device array designed to correspond to the TFT array and which may reduce manufacturing costs, prevent the surface of pixel electrodes from being damaged, and/or reduce the installation cost of higher vacuum equipment.

2. Description of Related Art

As information and communication technologies rapidly progress, technologies related to image display devices are also rapidly progressing. Cathode ray tubes (CRTs) have been widely used as display devices. However, CRTs may be heavy and bulky and may dissipate too much power. Thus, there may be a limit to the extent to which CRTs may be used as modern image display devices. To replace CRTs, new concept image display devices, for example thin film transistor liquid crystal displays (TFT LCD), organic light emission displays (OLED), plasma display panels (PDP), and projection televisions, have been developed.

A TFT LCD module may include three units, for example, a liquid crystal panel, a driver circuit, and a backlight. The liquid crystal panel may include two glass substrates and a liquid crystal layer interposed between the two glass substrates, and the driver circuit may include driver large scale integration (LSI) and various circuits that may be mounted on a printed circuit board (PCB) to drive the liquid crystal panel.

Figure 1:
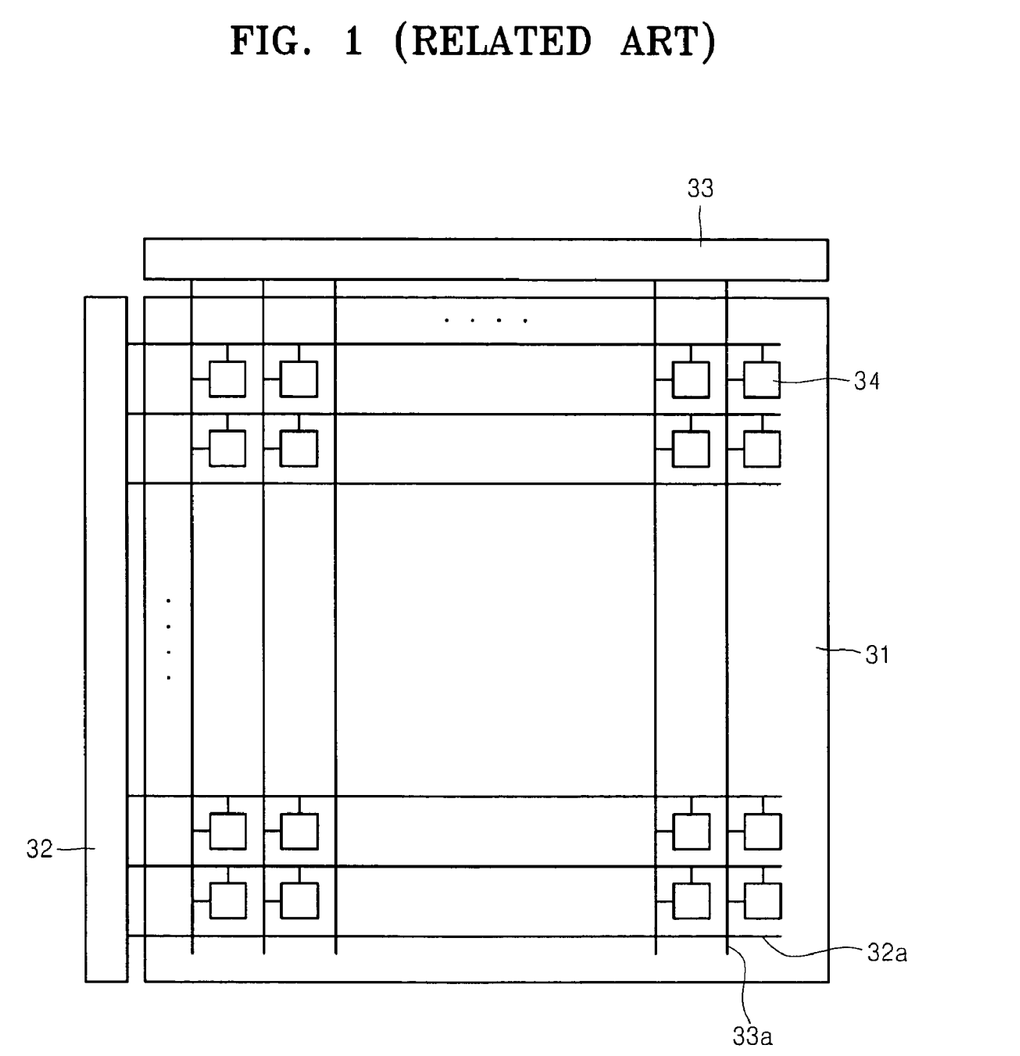
FIG. 1 is a schematic view of a related art TFT LCD.

FIG. 1 is a schematic view of a related art TFT LCD. Referring to FIG. 1, a related art TFT LCD may include a pixel array 31 having a plurality of unit pixels 34, a gate scan unit 32 driving the pixel array 31, and a data input unit 33. The gate scan unit 32 and the data input unit 33 may be connected to TFTs (not shown) of the respective unit pixels 34 through gate lines 32a and source lines 33a. On each of the unit pixels 34, pixel electrodes may be formed of indium tin oxide (ITO), for example, a transparent material having relatively high light transmittance. Because this TFT LCD may be well known, its detailed description will be omitted.

Inspection of a TFT LCD may be required to check for defects created during manufacture thereof. Various kinds of TFT-LCD inspection methods have been proposed.

One method is to use a modulator and a camera. For example, the modulator and the camera may be located on a TFT array substrate, and the TFT array substrate may be inspected according to brightness of an image observed through the camera. This method may be useful to inspect a small region of the TFT LCD, but it may be difficult to inspect the overall surface of the TFT LCD. Also, the modulator may have to be replaced if the modulator comes in contact with the TFT LCD substrate.

Another method may be to use an electron-gun type electron emission device. For example, the TFT array substrate may be inspected by measuring a current that may be output from the TFT array substrate when electrons are applied thereto. However, because electrons may have to be accelerated using a higher voltage, the TFT array itself may be damaged. Also, because this method may be performed in a relatively high vacuum (for example $10^{-7}$ to $10^{-8}$ Torr), manufacturing costs of large-sized vacuum equipment may be higher.

SUMMARY

Example embodiments provide a surface electron emission device array and a TFT inspection system including a surface electron emission device array that may selectively inspect unit TFTs and an entire TFT array at a lower cost.

According to an example embodiment, a surface electron emission device array may include a first electrode disposed in a first direction, a second electrode disposed in a second direction intersecting the first direction in a region corresponding to a region in which the first electrode is located, and an insulating layer interposed between the first electrode and the second electrode.

According to an example embodiment, there may be provided a TFT inspection system for inspecting a TFT array. The TFT inspection system may include a surface electron emission device array, which may have a first electrode disposed to face the TFT array in a first direction, a second electrode disposed in a second direction intersecting the first direction in a region corresponding to a region in which the first electrode and a corresponding pixel electrode of the TFT array may be formed, and an insulating layer interposed between the first electrode and the second electrode.

According to an example embodiment, there may be provided a method of inspecting a TFT array using a TFT inspection system, the TFT inspection system may include a surface electron emission device array having a first electrode disposed to face the TFT array in a first direction, a second electrode disposed in a second direction intersecting the first direction in a region corresponding to a region in which the first electrode and a corresponding pixel electrode of the TFT array may be formed, and an insulating layer interposed between the first electrode and the second electrode. The TFT inspection method may include applying a voltage to the first electrode and the second electrode of the surface electron emission device array corresponding to a pixel electrode electrically connected to a TFT to be inspected, thereby emitting electrons from a surface of the second electrode; turning on the TFT to be inspected by applying a voltage higher than a threshold voltage of the TFT to a gate line of the TFT array connected to the TFT to be inspected; measuring a current flowing through a source line of the TFT array connected to the TFT to be inspected; and determining whether the TFT may be operating normally.

According to an example embodiment, the TFT array may include a plurality of gate lines, a plurality of source lines, a plurality of unit TFTs connected to the gate lines and the source lines, and a plurality of pixel electrodes electrically connected to the unit TFTs.

According to an example embodiment, the insulating layer may further include an alternating sequence of insulating layers and conductive layers that begins with an insulating layer and ends with an insulating layer.

According to an example embodiment, the alternating sequence may be a first insulating layer, a conductive layer, and a second insulating layer.

According to an example embodiment, the first insulating layer may have a thickness of 1-30 nanometers and the second insulating layer may have a thickness of 1-30 nanometers.

According to an example embodiment, the first electrode and the second electrode may be formed of a metal selected from the group consisting of Au, Pt, Al, Ag.

According to an example embodiment, the insulating layer may be formed of an insulating material selected from the group consisting of $Al_2O_3$, $SiO_2$, $Si_3N_4$, HfO, NiO, MgO, SrO, SiN, BaO, TiO, $Ta_2O_5$, $BaTiO_3$, BaZrO, $ZrO_2$, $Y_2O_3$, ZrSiO, HfSiO, and $LaAlO_3$.

According to an example embodiment, a voltage may be applied between the first electrode and the second electrode that includes the insulating layer. The voltage may be greater than or equal to 10 V.

According to an example embodiment, a voltage may be applied between the first electrode and the second electrode that includes the first insulating layer, the conductive layer, and the second insulating layer. The voltage may be greater than or equal to 2 V.

According to an example embodiment, each source line of the TFT array may be connected to a switch, a current amplifier, and/or a current comparator.

According to an example embodiment, the surface electron emission device array may be operated in a vacuum environment of $10^{-4}$-$10^{-5}$ Torr.

According to an example embodiment, the TFT inspection system may further include a conductive layer within the insulating layer, such that a first insulating layer, the conductive layer, and a second insulating layer may be stacked in sequence.

According to an example embodiment, the conductive layer within the insulating layer may be a metal layer.

According to an example embodiment, the TFT array and the surface electron emission device may be spaced apart from each other by a distance of several micrometers to 10 millimeters.

According to an example embodiment, the first electrode may have a thickness of hundreds of nanometers to hundreds of micrometers, for example a thickness of 100 nanometers to 999 micrometers.

According to an example embodiment, the second electrode may have a thickness of 10-100 nanometers.

According to an example embodiment, the insulating layer may have a thickness of 1-30 nanometers.

According to an example embodiment, the conductive layer may have a thickness of 10-50 nanometers.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully with reference to accompanying drawings. In the drawings, thicknesses of layers and regions may be exaggerated for clarity. The term "TFT array" may mean a structure in which elements including pixel electrodes connected to TFTs may be arrayed in a matrix form.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Example embodiments provide a TFT inspection system for inspecting a TFT array, in which unit surface electron emission devices corresponding to unit TFTs of the TFT array may be in an array structure.

Figure 2A:
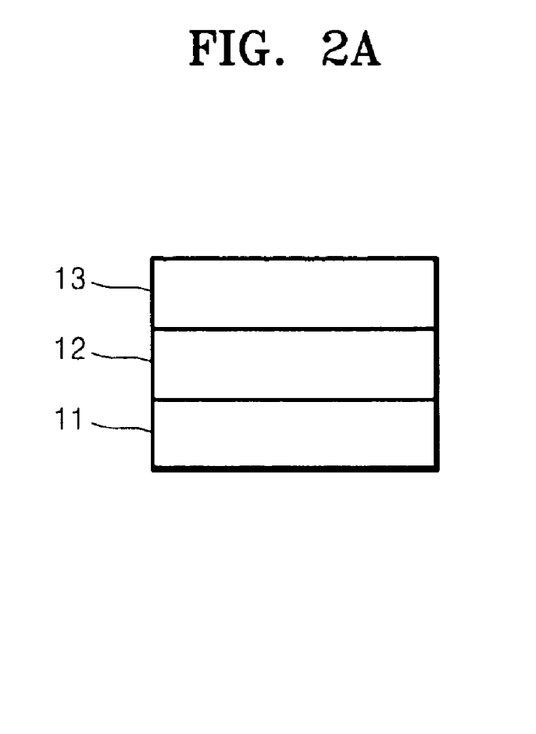
FIG. 2A is a sectional view of a surface electron emission device according to an example embodiment.
Figure 2B:
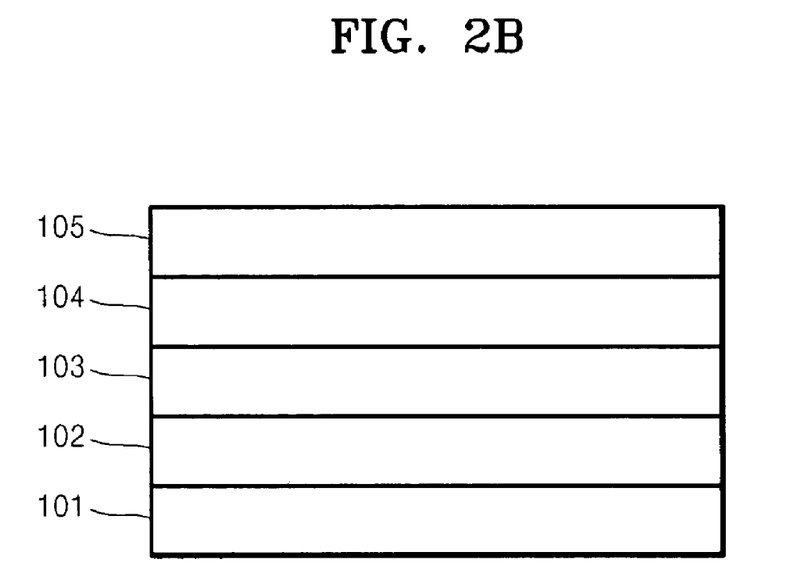
FIG. 2B is a sectional view of a surface electron emission device according to an example embodiment.
Figure 3:
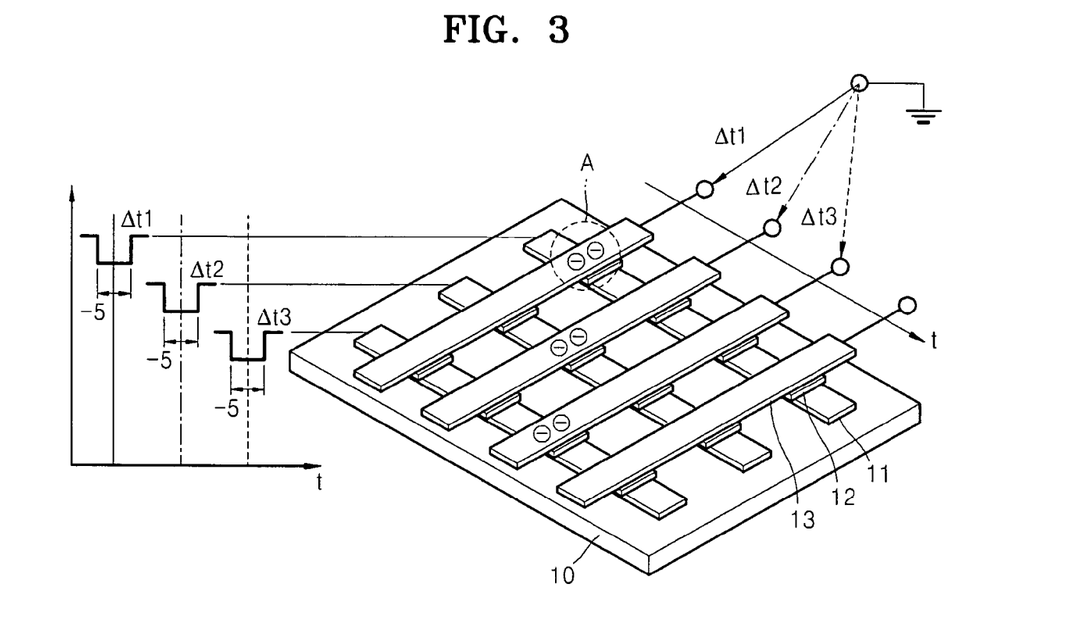
FIG. 3 is a perspective view of a surface electron emission device array according to an example embodiment.

FIGS. 2A and 2B are sectional views of unit surface electron emission devices according to example embodiments, and FIG. 3 is a perspective view of an array structure of the surface electron emission device illustrated in FIG. 2A. The surface electron emission device of example embodiments may have a metal-insulator-metal (MIM) structure or a metal-insulator-metal-insulator-metal (MIMIM) structure.

Figure 2C:
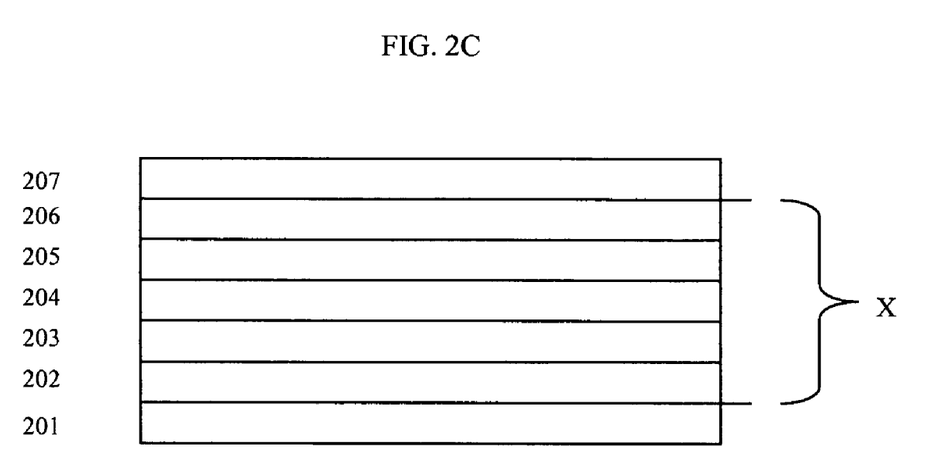
FIG. 2C is a sectional view of a surface electron emission device according to an example embodiment.

FIG. 2C is a sectional view of a unit electron emission device according to an example embodiment. The surface electron emission device of example embodiments may also have a (MXM) structure where X is an insulating layer containing an alternating sequence of insulating layers and conductive layers that begins with an insulating layer and ends with an insulating layer. For example, the surface electron emission device of example embodiments may have a metal-insulator-metal-insulator-metal-insulator-metal (MIMIMIM) structure, or a metal-insulator-metal-insulator-metal-insulator-metal-insulator-metal (MIMIMIMIM) structure, and so on. For example, a surface electron emission device array having the MIMIMIM structure according to an example embodiment may include a bottom electrode 201, a first insulating layer 202, a first conductive layer 203, a second insulating layer 204, a second conductive layer 205, a third insulating layer 206, and a top electrode 207. The bottom electrode 201 and/or the top electrode 207 may be formed of a conductive material generally used in semiconductor devices. For example, the bottom electrode 201 and/or the top electrode 207 may be formed of a metal selected from the group consisting of Au, Pt, Al, and Ag. The insulating layers may be formed of an insulating material selected from the group consisting of $Al_2O_3$, $SiO_2$, $Si_3N_4$, HfO, NiO, MgO, SrO, SiN, BaO, TiO, $Ta_2O_5$, $BaTiO_3$, BaZrO, $ZrO_2$, $Y_2O_3$, ZrSiO, HfSiO, and $LaAlO_3$. The bottom electrode 201 may be formed to have a thickness of hundreds of nanometers to hundreds of micrometers, for example a thickness of 100 nanometers to 999 micrometers, each insulation layer may be formed to a thickness of 1-30 nanometers, and the top electrode 207 may be formed to a thickness of 10-100 nanometers. Each conductive layer may be formed to a thickness of 10-50 nanometers.

Referring to FIG. 2A, the surface electron emission device having the MIM structure according to an example embodiment may include a bottom electrode 11, an insulating layer 12, and a top electrode 13. The bottom electrode 11 and/or the top electrode 13 may be formed of a conductive material generally used in semiconductor devices. For example, the bottom electrode 11 and/or the top electrode 13 may be formed of a metal selected from the group consisting of Au, Pt, Al, and Ag. The insulating layer 12 may be formed of an insulating material selected from the group consisting of $Al_2O_3$, $SiO_2$, $Si_3N_4$, HfO, NiO, MgO, SrO, SiN, BaO, TiO, $Ta_2O_5$, $BaTiO_3$, BaZrO, $ZrO_2$, $Y_2O_3$, ZrSiO, HfSiO, and $LaAlO_3$. Also, the bottom electrode 11 may be formed to have a thickness of hundreds of nanometers to hundreds of micrometers, for example a thickness of 100 nanometers to 999 micrometers, the insulation layer 12 may be formed to a thickness of 1-30 nanometers, and the top electrode 13 may be formed to a thickness of 10-100 nanometers.

Figure 7A:
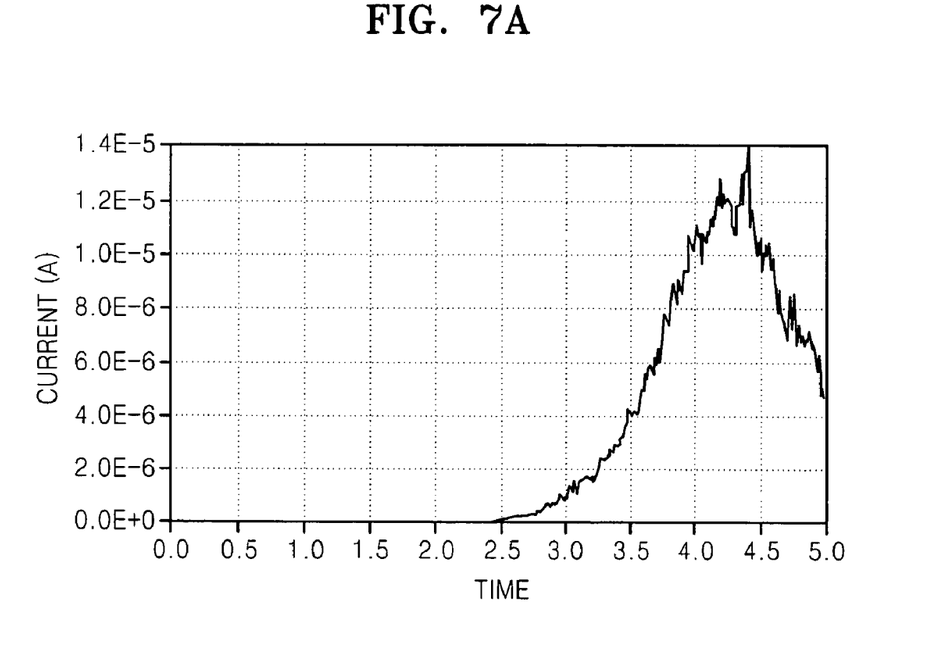
FIG. 7A is an example graph of a current emitted from the surface electron emission device versus time.

In the surface electron emission device of FIG. 2A, when a voltage of about 10 V or more is applied between the bottom electrode 11 and the top electrode 13 in a vacuum of $10^{-4}$-$10^{-5}$ Torr, electrons may be emitted from a surface of the top electrode 13. FIG. 7A is a graph of the current emitted from the surface of the top electrode 13 when a voltage was applied between the bottom electrode 11 and the top electrode 13 of the surface electron emission device illustrated in FIG. 2A. Referring to FIG. 7A, when a voltage of about 10 V was applied between the bottom electrode 11 and the top electrode 13, the current emitted from the surface of the top electrode 13 was measured. Also, it may be seen from FIG. 7B that a maximum current (14 μA) was measured at a voltage of about 18 V.

Referring to FIG. 2B, the surface electron emission device having the MIMIM structure according to an example embodiment may include a first electrode 101, a first insulating layer 102, a conductive layer 103, a second insulating layer 104, and a second electrode 105. The first electrode 101, the conductive layer 103, and the second electrode 105 may be formed of a conductive material or metal oxide generally used in semiconductor devices. Also, the first insulating layer 102 and the second insulating layer 104 may be formed of an insulating material for example $Al_2O_3$. The first electrode 101 may be formed to a thickness of hundreds of nanometers to hundreds of micrometers, for example a thickness of 100 nanometers to 999 micrometers, the first insulation layer 102 and the second insulating layer 104 may be formed to a thickness of 1-30 nanometers, the conductive layer 103 may be formed to a thickness of 10-50 nanometers, and the second electrode 105 may be formed to have a thickness of 10-100 nanometers.

Figure 8A:
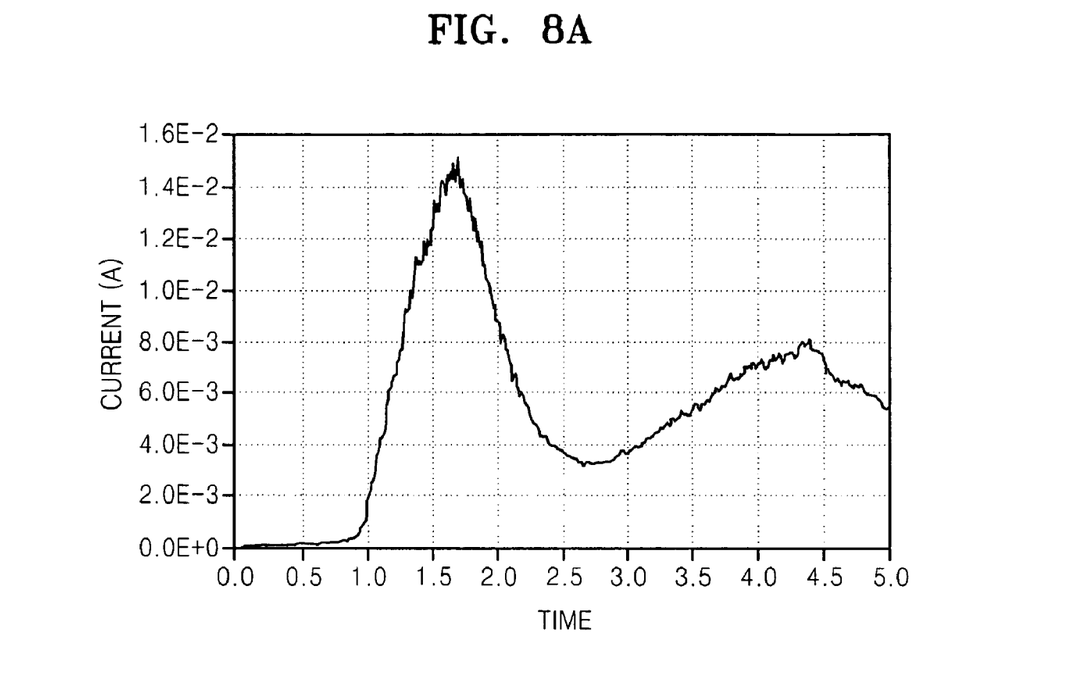
FIG. 8A is an example graph of a current emitted from the surface electron emission device versus time.
Figure 8B:
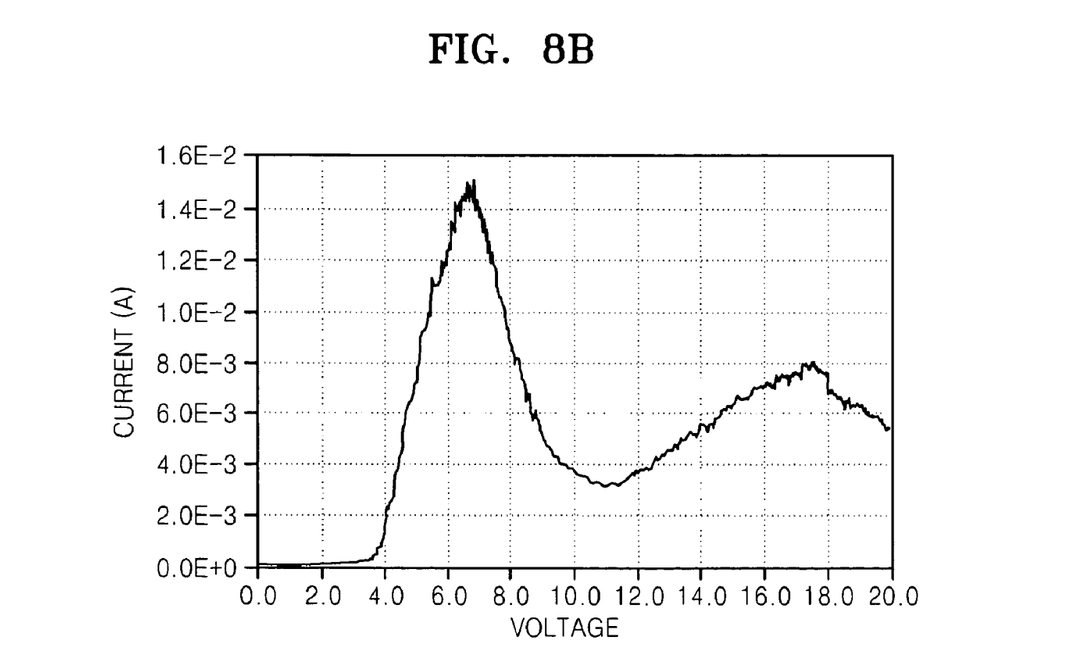
FIG. 8B is an example graph of a circulating I-V curve of the surface electron emission device.

Like the surface electron emission device of FIG. 2A, the surface electron emission device of FIG. 2B may emit electrons from a surface of the second electrode 105 when a voltage of about 2 V or more is applied between the first electrode 101 and the second electrode 105 in a vacuum of $10^{-4}$-$10^{-5}$ Torr. FIG. 8A is a graph of the current of electrons emitted from the surface of the top electrode 105 when a voltage was applied between the first electrode 101 and the second electrode 105 of the surface electron emission device illustrated in FIG. 2B. Referring to FIG. 8A, when a voltage of about 2 V was applied through the first electrode 101 and the second electrode 105, the current of electrons emitted from the surface of the second electrode 105 was measured. Also, it may be seen from FIG. 8B that a maximum current was measured at a voltage of about 7 V.

FIG. 3 is a perspective view of a surface electron emission device array according to an example embodiment. Although the surface electron emission device array having the MIM structure of FIG. 2A is illustrated in FIG. 3, a surface electron emission device array having the MIMIM structure of FIG. 2B may also be used.

A method of manufacturing the surface electron emission device array of FIG. 3 will now be described. A conductive metal or metal oxide may be coated on a substrate 10 and may be patterned to form the bottom electrode 11. An insulating material for example $Al_2O_3$ may be coated on the substrate 10 and the bottom electrode 11 and patterned to form an insulting layer 12. A metal or metal oxide may be coated on the resultant structure and patterned in a direction crossing the bottom electrode 11 to form the top electrode 13.

Figure 6:
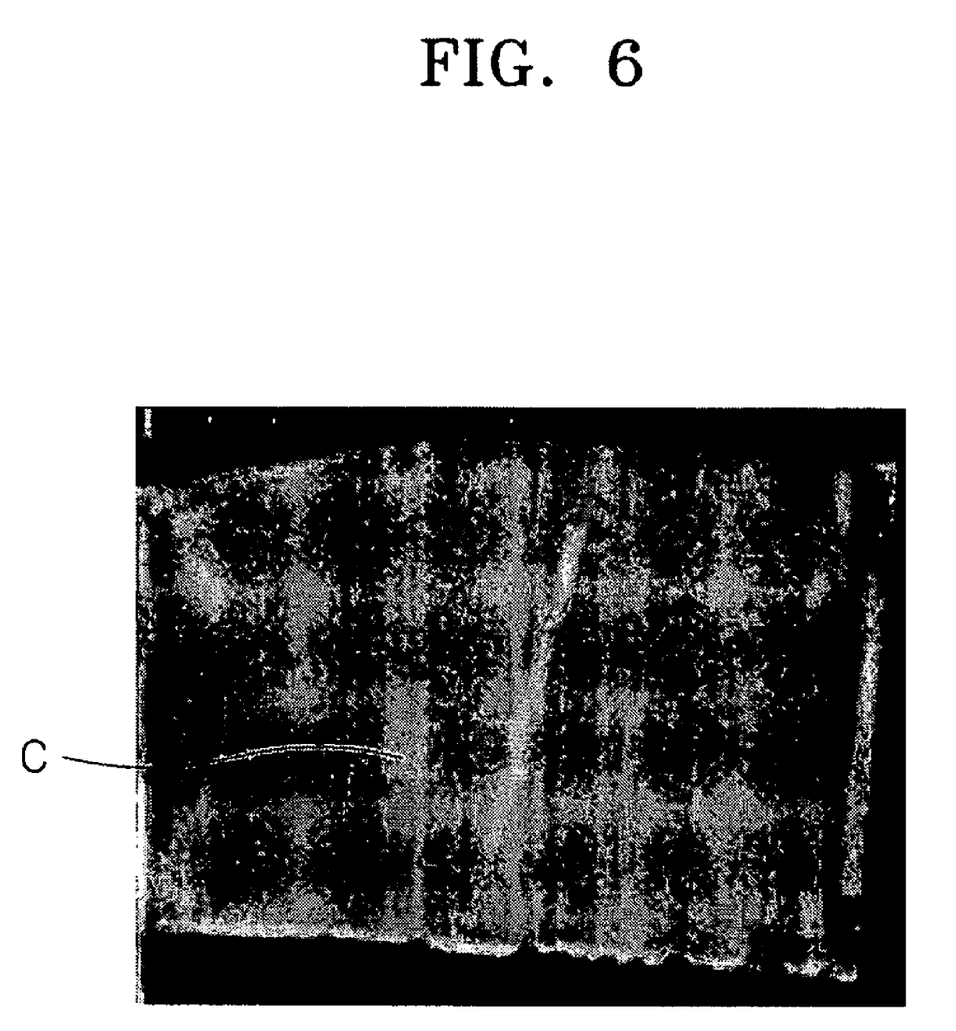
FIG. 6 is an example photograph of a surface electron emission phenomenon occurring when the surface electron emission device array of an example embodiment is driven.

It should be noted that a unit surface electron emission device A intersecting with the bottom electrode 11 and the top electrode 13 may be formed to correspond to a unit region of the inspection target, for example, the TFT array. For example, when a TFT LCD is inspected, the unit surface electron emission device may be formed to correspond to a pixel electrode region of a TFT array. Referring to FIG. 3, when a voltage is applied to the bottom electrodes 11, and the top electrode 13 is grounded, electrons may be emitted from the top electrode 13. FIG. 6 is a photograph of electron emission induced from a specific surface electron emission device A of the surface electron emission device array illustrated in FIG. 3.

Figure 4:
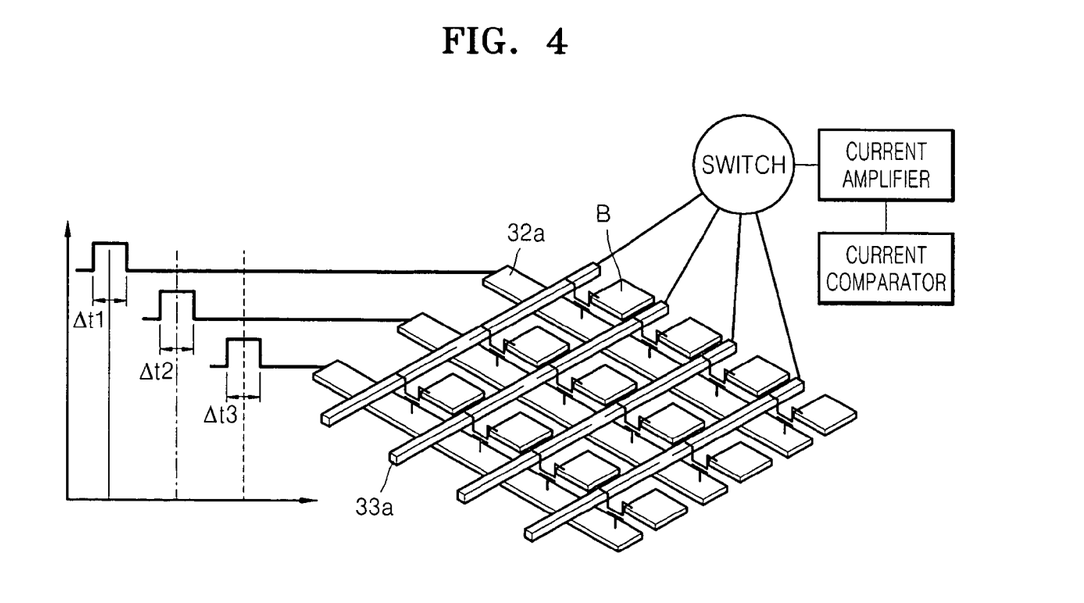
FIG. 4 is an example perspective view of a TFT array of a display device that may be an inspection target.

FIG. 4 is a perspective diagram of an example TFT array to be inspected. For example, FIG. 4 is an equivalent circuit of the TFT array illustrated in FIG. 1. Referring to FIG. 4, each source line 33a of the TFT array may be connected to a switch, a current amplifier, and a current comparator. The surface electron emission device array of FIG. 3 may be formed according to the same specification as the TFT array of FIG. 1. To inspect the TFT array, the surface electron emission device array of FIG. 3 may be disposed to correspond to the TFT array of FIG. 4. This arrangement will be described below in detail with reference to FIG. 5.

Figure 5:
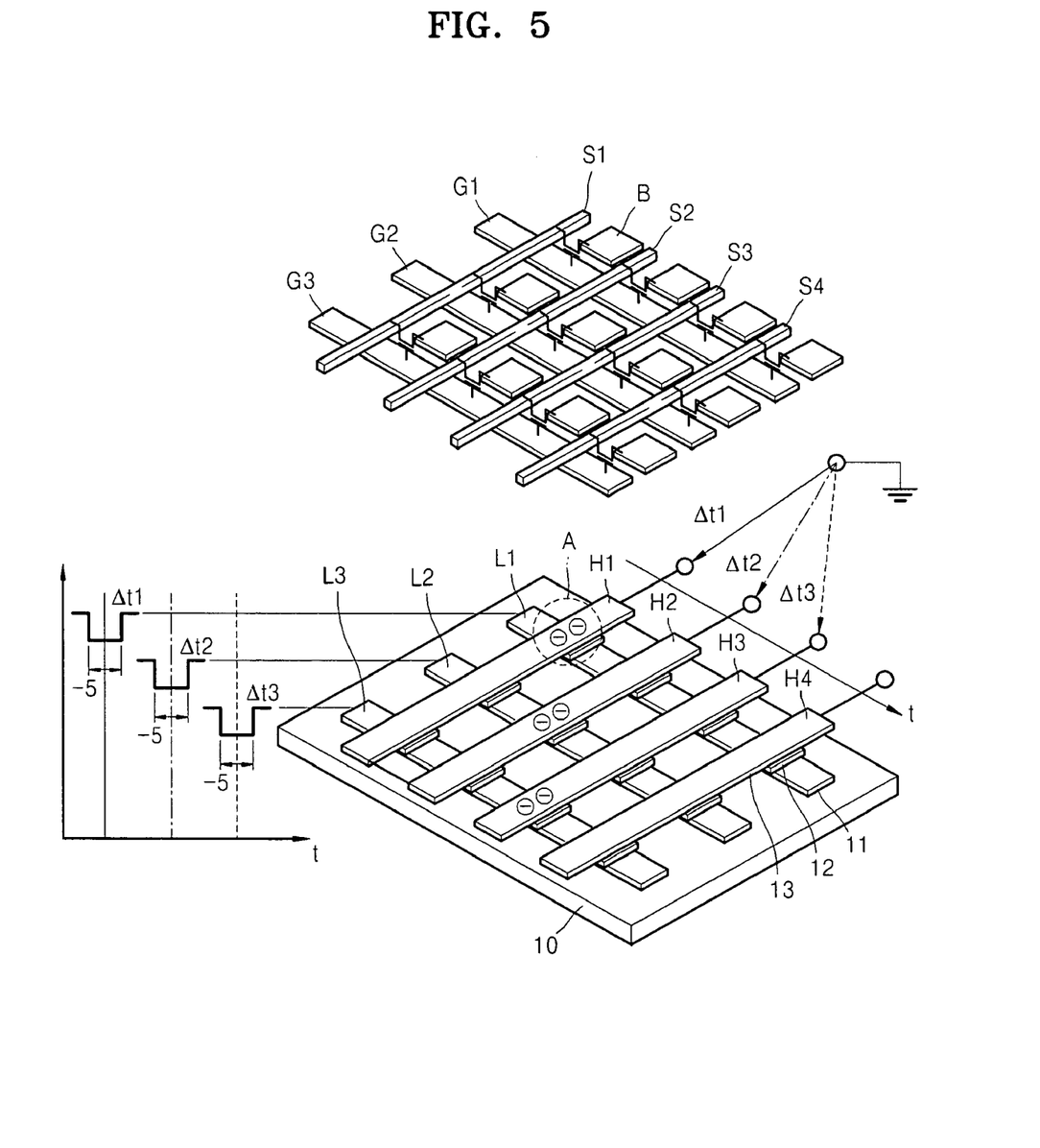
FIG. 5 is an example perspective view of a TFT inspection system using the surface electron emission device array according to an example embodiment.

FIG. 5 is a perspective view of a TFT inspection system using a surface electron emission device array according to an example embodiment. Referring to FIG. 5, each of a plurality of unit surface electron emission devices A of the surface electron emission device array may be formed to correspond to a pixel electrode B of a TFT array. A gap between the surface electron emission device array and the TFT array may be several micrometers to 10 millimeters. A vacuum environment of $10^{-4}$-$10^{-5}$ Torr may be maintained so as to induce the electron emission from the surface electron emission device.

The respective surface electron emission devices of the surface electron emission device array may induce electron emission by selectively applying a voltage to the bottom electrodes L1, L2 and L3 and the top electrodes H1, H2, H3 and H4. Also, the electron emission may be induced from the desired surface electron emission device by applying a voltage to the respective electrodes during time intervals Δt1, Δt2 and Δt3. A method of inspecting the TFTs connected to the pixel electrodes B of the TFT array by emitting electrons from a surface electron emission device A will now be described.

The TFT to be inspected may be selected and electrons may be emitted from the surface electron emission device corresponding to the pixel electrode electrically connected to the selected TFT. The selected TFT may be turned on by applying a voltage higher than a threshold voltage to a gate line of the selected TFT. A current flowing through a source line connected to the selected TFT may be measured. In this manner, the TFT inspection system may inspect whether the TFT may be operating normally.

Figure 7B:
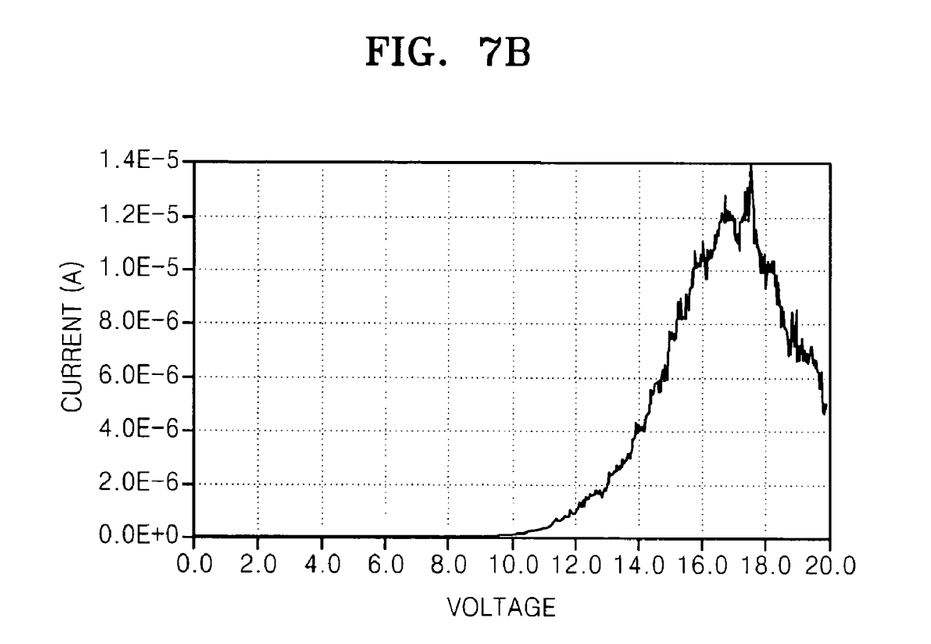
FIG. 7B is an example graph of a circulating I-V curve of the surface electron emission device.

For example, the top electrode H1 connected to the surface electron emission device A may be grounded, and a voltage may be applied to the bottom electrode L1 during Δt1. If the surface electron emission device has the MIM structure, a voltage of 10 V or more may be applied through the bottom electrode L1. As illustrated in FIG. 7B, electrons may be emitted from a surface of the top electrode H1 of the surface electron emission device A in a vacuum of $10^{-4}$-$10^{-5}$ Torr when a voltage of 10 V or more is applied thereto. The electrons may be emitted toward the pixel electrode B corresponding to the surface electron emission device A.

When the TFT is turned on by applying the voltage higher than the threshold voltage of the TFT to the gate electrode G1, the electrons emitted toward the pixel electrode B may flow through a channel region to the source line S1. When the switch is turned on, the current flowing through the source line S1 may be amplified by the current amplifier. Then, the current comparator may compare the amplified current with a desired and/or predetermined reference current. When the amplified current is higher than the desired and/or predetermined reference current, it may be determined that the gate electrode G1 connected to the pixel electrode B and the source electrode S1 may be operating normally. The current amplifier and the current comparator may be selectively implemented.

The whole TFT array may be inspected by performing the above-described operation on all the pixel electrodes at desired and/or predetermined time intervals. When a desired current is not detected, it may be determined that there may be damage to or contact failure may occur in the TFT connected to the pixel electrode, the gate line, or the source line. When the inspection of the pixel electrode is finished, subsequent pixel electrodes may be sequentially inspected in the above-described manner. The inspection order of the pixel electrodes and the selection of the detected current may not be restricted in example embodiments.

Because the TFT array may be generally fabricated in the standardized mass production system, the surface electron emission device array may be fabricated based on the standard of the TFT array.

The TFT inspection system according to example embodiments may have the following advantages.

The inspection of the TFT array may be completed in a shorter time using the surface electron emission device array that may be formed based on the standard of the TFT array and arranged to correspond to the TFTs.

The structure and manufacturing process of the surface electron emission device array may be simplified, thereby reducing manufacturing costs of the inspection system.

Because the gap between the TFT array and the inspection system may be maintained above a desired and/or predetermined range, the surface of the pixel electrode may be prevented from being damaged.

Because the degree of vacuum may be maintained at $10^{-4}$-$10^{-5}$ Torr, the installation cost of the higher vacuum equipment may be reduced.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed is:

1. A thin film transistor (TFT) inspection system for inspecting a TFT array, the TFT inspection system including a surface electron emission device array comprising: a plurality of first electrodes extending in a first direction; a plurality of second electrodes extending in a second direction, the second electrodes crossing the first electrodes, each crossing forming a surface electron emission device so as to form the surface electron emission device array, each surface electron emission device being positioned within a distance of a corresponding pixel of the TFT array that permits formation of a current path between the surface electron emission device and the corresponding pixel; and an insulating layer interposed between each of the first electrodes and each of the second electrodes at each of the crossings.

2. The TFT inspection system of claim 1, wherein the TFT array includes a plurality of gate lines, a plurality of source lines, a plurality of unit TFTs connected to the gate lines and the source lines, and a plurality of pixel electrodes electrically connected to the unit TETs.

3. The TFT inspection system of claim 2, wherein each source line is connected to a switch, a current amplifier, and a current comparator.

4. The TFT inspection system of claim 1, wherein the insulating layer further includes an alternating sequence of insulating layers and conductive layers that begins with an insulating layer and ends with an insulating layer.

5. The TFT inspection system of claim 4, wherein the alternating sequence is a first insulating layer, a conductive layer, and a second insulating layer.

6. The TFT inspection system of claim 5, wherein a voltage is applied between the first electrodes and the second electrodes.

7. The TFT inspection system of claim 5, wherein the conductive layer has a thickness of 10-50 nanometers.

8. The TFT inspection system of claim 5, wherein the first insulating layer has a thickness of 1-30 nanometers and the second insulating layer has a thickness of 1-30 nanometers.

9. The TFT inspection system of claim 1, wherein the TFT array and the surface electron emission device array are spaced apart from each other by a distance of several micrometers to 10 millimeters.

10. The TFT inspection system of claim 1, wherein the first electrode and the second electrode is formed of a metal selected from the group consisting of Au, Pt, Al, Ag.

11. The TFT inspection system of claim 1, wherein the insulating layer is formed of an insulating material selected from the group consisting of $Al_2O_3$, $SiO_2$, $Si_3N_4$, HfO, NiO, MgO, SrO, SiN, BaO, TiO, $Ta_2O_5$, $BaTiO_3$, BaZrO, $ZrO_2$, $Y_2O_3$, ZrSiO, HfSiO, and $LaAlO_3$.

12. The TFT inspection system of claim 1, wherein a voltage is applied between the first electrodes and the second electrodes.

13. The TFT inspection system of claim 12, wherein the voltage applied between the first electrodes and the second electrodes is greater than or equal to 10 V.

14. The TFT inspection system of claim 6, wherein the voltage applied between the first electrodes and the second electrode is greater than or equal to 2 V.

15. The TFT inspection system of claim 1, wherein the first electrodes have a thickness of 100 nanometers to 999 micrometers.

16. The TFT inspection system of claim 1, wherein the second electrodes have a thickness of 10-100 nanometers.

17. The TFT inspection system of claim 1, wherein the insulating layer has a thickness of 1-30 nanometers.

18. The TFT inspection system of claim 1, wherein the surface electron emission device array is operated in a vacuum environment of $10^{-4}$-$10^{-5}$ Torr.

19. A method of inspecting a TFT array using a TFT inspection system, the TFT inspection system including a surface electron emission device array having a plurality of first electrodes extending in a first direction, a plurality of second electrodes extending in a second direction, the second electrodes crossing the first electrodes, each crossing forming a surface electron emission device so as to form the surface electron emission device array, each surface electron emission device being positioned within a distance of a corresponding pixel of the TFT array that permits formation of a current path between the surface electron emission device and the corresponding pixel, and an insulating layer interposed between each of the first electrodes and each of the second electrodes at each of the crossings, the TFT inspection method comprising: applying a voltage to one of the first electrodes and one of the second electrodes of the surface electron emission device array, thereby forming the current path between the surface electron emission device and the corresponding pixel of the TFT array; turning on the TFT array to be inspected by applying a voltage higher than a threshold voltage of the TFT array to a gate line of the TFT array to be inspected; measuring a current flowing through a source line of the TFT array to be inspected; and determining whether the corresponding pixel of the TFT array is operating normally.

20. The method of claim 19, wherein the TFT array includes a plurality of gate lines, a plurality of source lines, a plurality of unit TFTs connected to the gate lines and the source lines, and a plurality of pixel electrodes, each connected to one of the unit TFTs.

21. The method of claim 19, further comprising operating the surface electron emission device array in a vacuum environment of $10^{-4}$-$10^{-5}$ Torr.

22. The method of claim 19, wherein the insulating layer further includes an alternating sequence of insulating layers and conductive layers that begins with an insulating layer and ends with an insulating layer.

* * * * *